United States Patent
Isobe et al.

(10) Patent No.: US 10,876,207 B2
(45) Date of Patent: Dec. 29, 2020

(54) SUBSTRATE PROCESSING APPARATUS, LIQUID PRECURSOR REPLENISHMENT SYSTEM, AND METHOD OF MANUFACTURING SEMICONDUCTOR DEVICE

(71) Applicant: KOKUSAI ELECTRIC CORPORATION, Tokyo (JP)

(72) Inventors: Noriyuki Isobe, Toyama (JP); Kenichi Suzaki, Toyama (JP); Takeshi Kasai, Toyama (JP); Yoshitaka Kawahara, Toyama (JP); Masakazu Shimada, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/354,313

(22) Filed: Mar. 15, 2019

(65) Prior Publication Data

US 2019/0211449 A1    Jul. 11, 2019

Related U.S. Application Data

(63) Continuation of application No. PCT/JP2017/034050, filed on Sep. 21, 2017.

(30) Foreign Application Priority Data

Sep. 21, 2016   (JP) ................................. 2016-184537

(51) Int. Cl.
    *C23C 16/455*     (2006.01)
    *C23C 16/52*      (2006.01)
    (Continued)

(52) U.S. Cl.
    CPC ...... *C23C 16/45544* (2013.01); *C23C 16/403* (2013.01); *C23C 16/4482* (2013.01);
    (Continued)

(58) Field of Classification Search
    None
    See application file for complete search history.

(56) References Cited

U.S. PATENT DOCUMENTS 4,979,643 A * 12/1990 Lipisko ............... C23C 16/4482
                                                222/541.1
6,077,356 A    6/2000 Bouchard
(Continued)

FOREIGN PATENT DOCUMENTS

| JP | 2001-503106 A | 3/2001 |
|----|---------------|--------|
| JP | 2008-524443 A | 7/2008 |

(Continued)

OTHER PUBLICATIONS

International Search Report dated Feb. 13, 2018 of the PCT International Application No. PCT/JP2017/034050.

(Continued)

*Primary Examiner* — Steven M Christopher
(74) *Attorney, Agent, or Firm* — Volpe Koenig

(57) ABSTRACT

There is provided a technique that includes: a process chamber accommodating substrate; a storage tank including bottom portion having recess and wall portion and storing liquid precursor; a vaporizing part vaporizing the stored liquid precursor to generate precursor gas; a supply part supplying the generated precursor gas to the process chamber; a sensor disposed in the recess and detecting liquid level of the stored liquid precursor; a replenishment part replenishing the liquid precursor in the storage tank; and a controller controlling the supply part to supply the precursor gas to the process chamber to perform a substrate processing process for processing the substrate, and controlling, each time when the substrate processing process is performed a predetermined number of times, the replenishment part, based on the detected liquid level, to replenish the liquid (Continued)

precursor in the storage tank so that the liquid level becomes a predetermined level.

11 Claims, 7 Drawing Sheets

(51) Int. Cl.
H01L 21/02 (2006.01)
C23C 16/40 (2006.01)
C23C 16/448 (2006.01)
C23C 16/46 (2006.01)

(52) U.S. Cl.
CPC ........ *C23C 16/45523* (2013.01); *C23C 16/46* (2013.01); *C23C 16/52* (2013.01); *H01L 21/0228* (2013.01); *H01L 21/02178* (2013.01)

(56) References Cited

U.S. PATENT DOCUMENTS

| | | | |
|---|---|---|---|
| 2006/0133955 A1* | 6/2006 | Peters | C23C 16/4481 422/63 |
| 2012/0216712 A1* | 8/2012 | Paranjpe | C23C 16/56 106/287.18 |
| 2014/0084389 A1 | 3/2014 | Ogawa | |
| 2015/0243499 A1 | 8/2015 | Yamamoto et al. | |

FOREIGN PATENT DOCUMENTS

| | | |
|---|---|---|
| JP | 2012-515842 A | 7/2012 |
| JP | 2014-067877 A | 4/2014 |
| KR | 20070097038 A | 10/2007 |
| KR | 20110122823 A | 11/2011 |
| KR | 20150100570 A | 9/2015 |

OTHER PUBLICATIONS

Korean Office Action dated Jun. 9, 2020 for the Korean Patent Application No. 10-2019-7006838.

* cited by examiner

SUBSTRATE PROCESSING APPARATUS, LIQUID PRECURSOR REPLENISHMENT SYSTEM, AND METHOD OF MANUFACTURING SEMICONDUCTOR DEVICE

CROSS-REFERENCE TO RELATED APPLICATION

This application is a Bypass Continuation Application of PCT International Application No. PCT/JP2017/034050, filed Sep. 21, 2017, the disclosure of which is incorporated herein in its entirety by reference.

TECHNICAL FIELD

The present disclosure relates to a substrate processing apparatus, a liquid precursor replenishment system, and a method of manufacturing a semiconductor device.

BACKGROUND

In the related art, a film-forming process for forming a film on a substrate accommodated in a process chamber is disclosed as one of the processes of manufacturing a semiconductor device.

In a film-forming process, a precursor gas (for example, trimethylaluminum (Al (CH$_3$)$_3$), abbreviation: TMA) is used. This precursor gas contains impurities at a parts-per-billion (ppb) level. An in-plane uniformity value of a film formed on a substrate varies depending on the amount of impurities.

SUMMARY

Some embodiments of the present disclosure provide a technique capable of suppressing variations in an in-plane uniformity value of a film formed on a substrate.

According to one embodiment of the present disclosure, there is provided a technique that includes: a process chamber in which a substrate is accommodated; a storage tank formed to include a bottom portion having a recess and a wall portion extending upward from a peripheral edge of the bottom portion, and configured to store a liquid precursor; a vaporizing part configured to vaporize the liquid precursor stored in the storage tank to generate a precursor gas; a supply part configured to supply the precursor gas generated by the vaporizing part to the process chamber; a sensor disposed in the recess and configured to detect a liquid level of the liquid precursor stored in the storage tank; a replenishment part configured to replenish the liquid precursor in the storage tank; and a controller configured to control the supply part to supply the precursor gas to the process chamber to perform a substrate processing process for processing the substrate, and configured to, each time when the substrate processing process is performed a predetermined number of times, control the replenishment part, based on the liquid level of the liquid precursor detected by the sensor, to replenish the liquid precursor in the storage tank so that the liquid level of the liquid precursor stored in the storage tank becomes a predetermined level.

DETAILED DESCRIPTION

Figure 1:
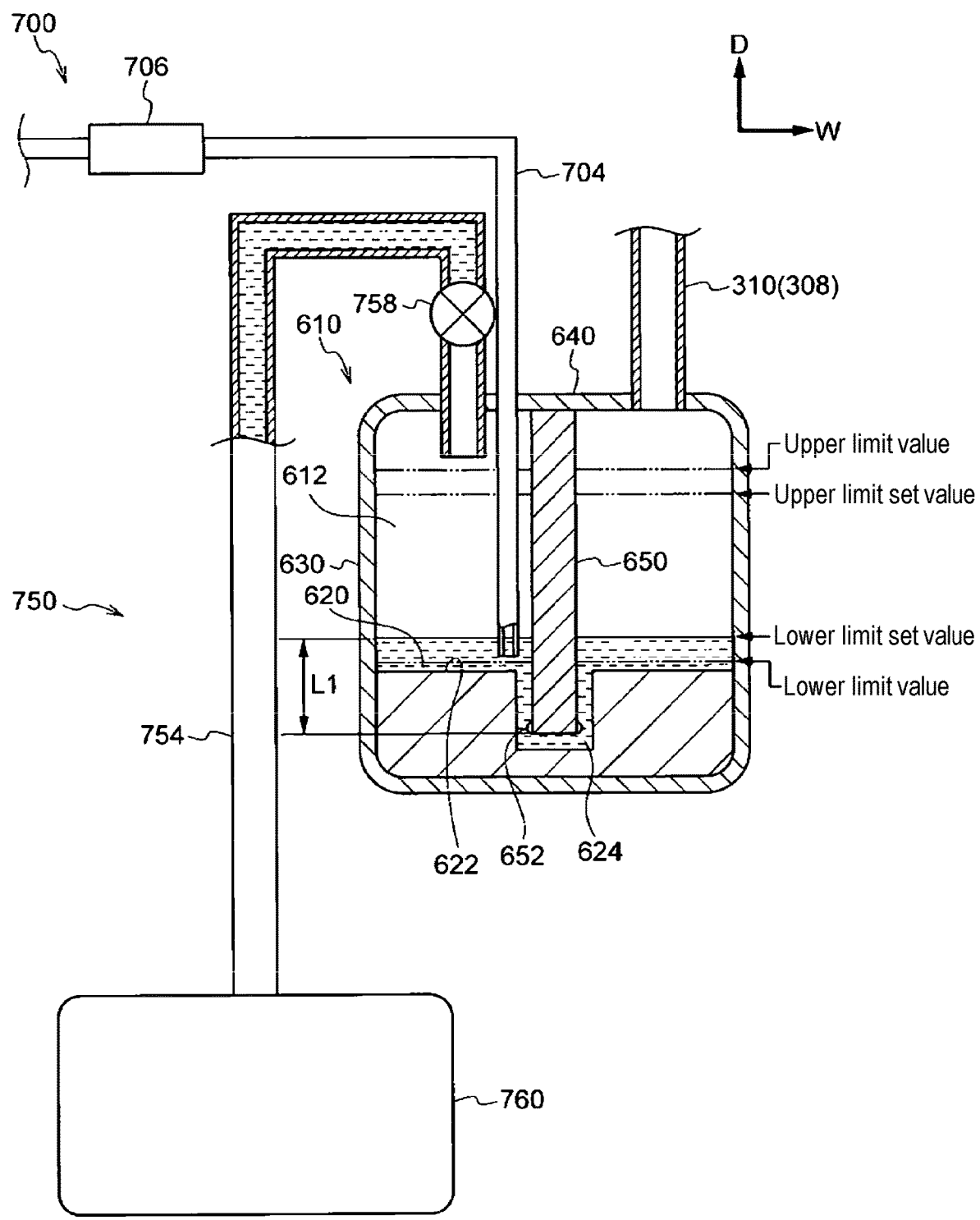
FIG. 1 is a configuration diagram showing a storage tank and the like included in a substrate processing apparatus according to an embodiment of the present disclosure.

Embodiments of the present disclosure will be now described in detail with reference to the drawings. Like or equivalent components, members, and processes illustrated in each drawing are given like reference numerals and a repeated description thereof will be properly omitted. Further, the embodiments are presented by way of example only, and are not intended to limit the present disclosure, and any feature or combination thereof described in the embodiments may not necessarily be essential to the present disclosure.

The present inventors have earnestly studied on a relationship between an amount of a liquid precursor stored in a storage tank and the in-plane uniformity of a film formed on a substrate by a precursor gas generated by vaporizing the liquid precursor. As a result, the present inventors have reached the present disclosure based on the following findings.

The present inventors have found that a concentration of impurities contained in a vaporized precursor gas varies depending on an amount (remaining amount) of a liquid precursor stored in a storage tank. This is because the concentration of impurities contained in a vaporized precursor gas (TMA gas) varies depending on the remaining amount of a liquid precursor (TMA) stored in the storage tank. That is, although the impurities are saturated in the liquid precursor at any remaining amount, the concentration thereof is slightly changed.

In this regard, when the amount of the liquid precursor stored in the storage tank decreases, the value of the in-plane uniformity of the film formed on the substrate grows small. In contrast, when the amount of the liquid precursor stored in the storage tank increases, the value of the in-plane uniformity of the film formed on the substrate increases. That is, the in-plane uniformity value of the film formed on the substrate varies depending on the amount of the liquid precursor stored in the storage tank.

The in-plane uniformity is calculated by the following equation (1) using a maximum in-plane film thickness, a minimum in-plane film thickness and an average in-plane film thickness of a film formed on a substrate.

In-plane uniformity=[(maximum in-plane film thickness−minimum in-plane film thickness)/(average in-plane film thickness×2)]×100 (±%) (1)

As can be seen from this equation, the smaller the in-plane uniformity value is, the smaller a difference between the maximum in-plane film thickness and the minimum in-plane film thickness is. As compared with a case where the in-plane uniformity value is large, the in-plane uniformity is improved.

Figure 6A:
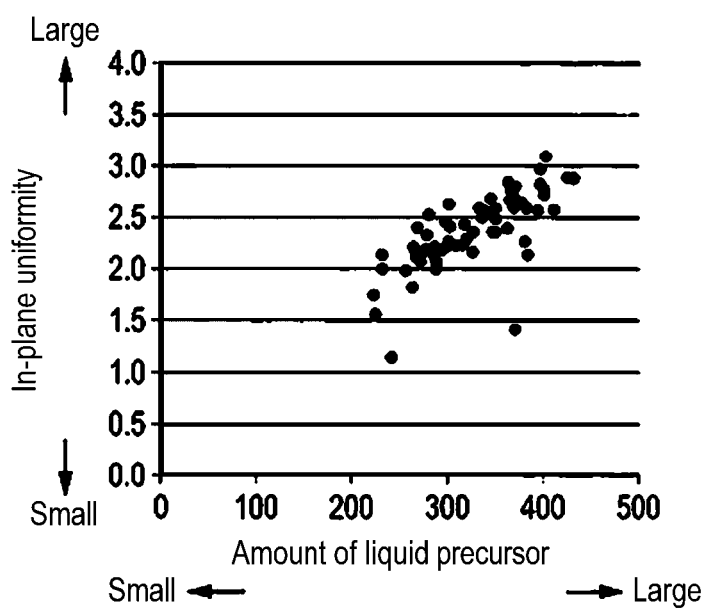
FIGS. 6A and 6B are views used for explaining the necessity of the substrate processing apparatus according to the embodiment of the present disclosure, in which the relationship between the in-plane uniformity and the amount of a liquid precursor remaining in a storage tank is shown in a graph.
Figure 6B:
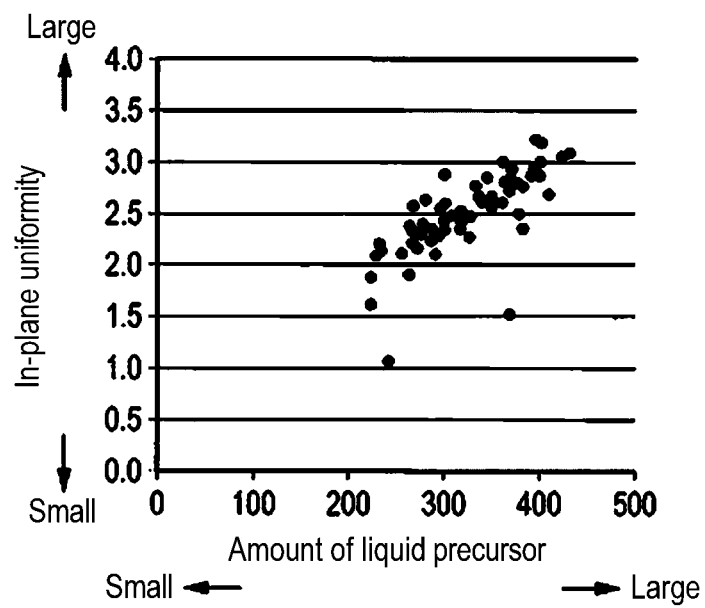
Figure 7:
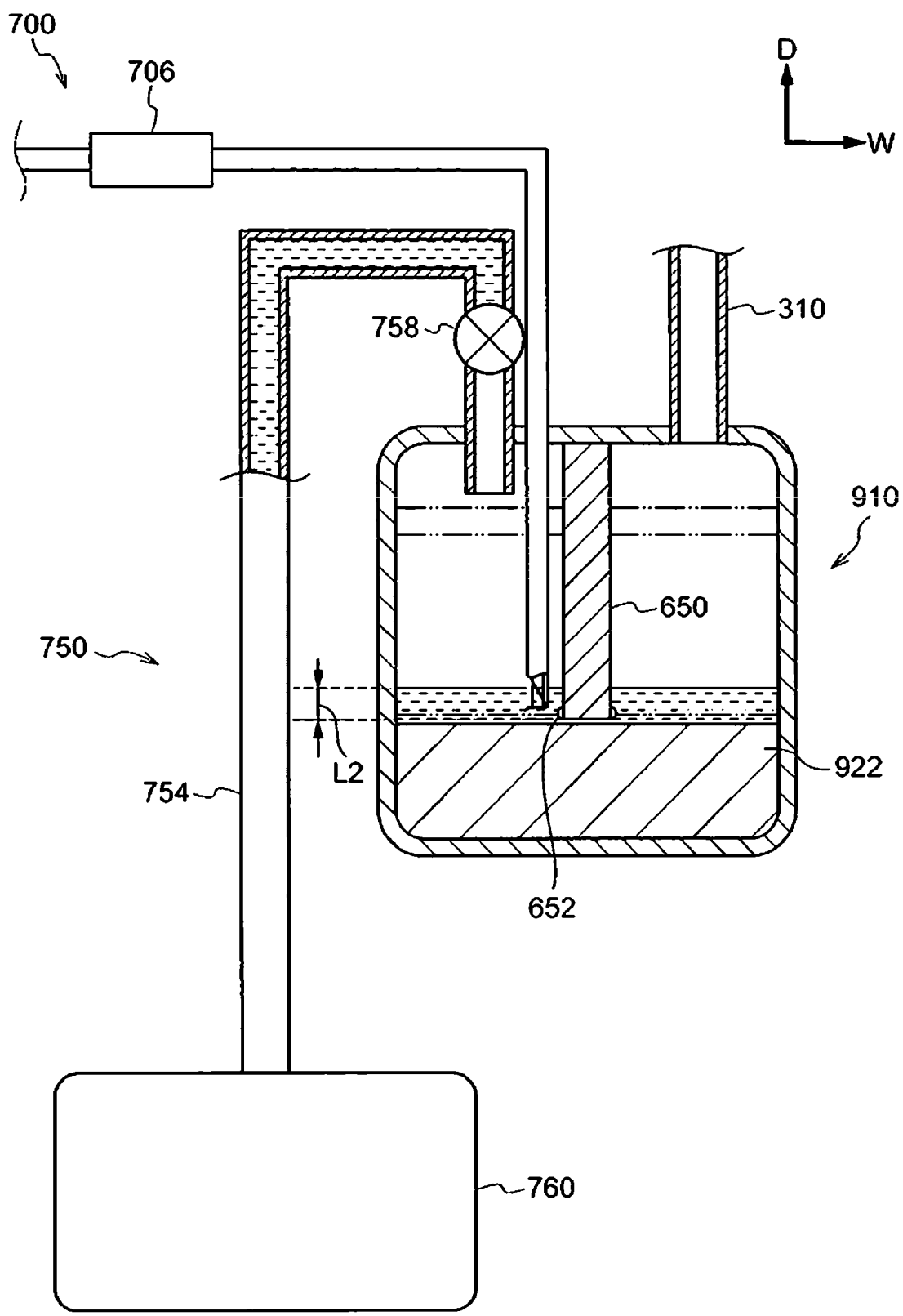
FIG. 7 is a configuration diagram showing a storage tank and the like included in a substrate processing apparatus according to a comparative embodiment against the substrate processing apparatus according to the embodiment of the present disclosure.

The following description will be made with reference to graphs. FIGS. 6A and 6B show, in graphs, the relationship between the in-plane uniformity and the amount of the liquid precursor stored in the storage tank. The vertical axis in each of the graphs of FIGS. 6A and 6B indicates the in-plane uniformity, and the horizontal axis indicates the amount of the liquid precursor stored in the storage tank.

FIG. 6A shows a film formed on the uppermost (TOP) substrate among a plurality of substrates loaded on a boat (details of which will be described later), and FIG. 6B shows a film formed on the lowermost (BTM) substrate among a plurality of substrates loaded on a boat.

As shown in FIGS. 6A and 6B, when the amount of the liquid precursor stored in the storage tank decreases, the in-plane uniformity value of the film formed on the substrate decreases. When the amount of the liquid precursor stored in the storage tank increases, the in-plane uniformity value of the film formed on the substrate becomes large.

This is because, when batch processing is completed in order to form a film on a substrate, the amount of the liquid precursor in the storage tank becomes small and the liquid level becomes low. In this state, if the liquid precursor is vaporized, the impurity concentration in the vaporized precursor gas becomes low.

Hereinafter, preferred embodiments of the present disclosure will be described.

(Overall Configuration)

An example of a substrate processing apparatus, a liquid precursor replenishment system, a method of manufacturing a semiconductor device and a program according to an embodiment of the present disclosure will be described with reference to FIGS. 1 to 7. An arrow H in the figures indicates an up-down direction (vertical direction) of the apparatus, an arrow W indicates a width direction (horizontal direction) of the apparatus, and an arrow D indicates a width direction (horizontal direction) of the apparatus.

Figure 3:
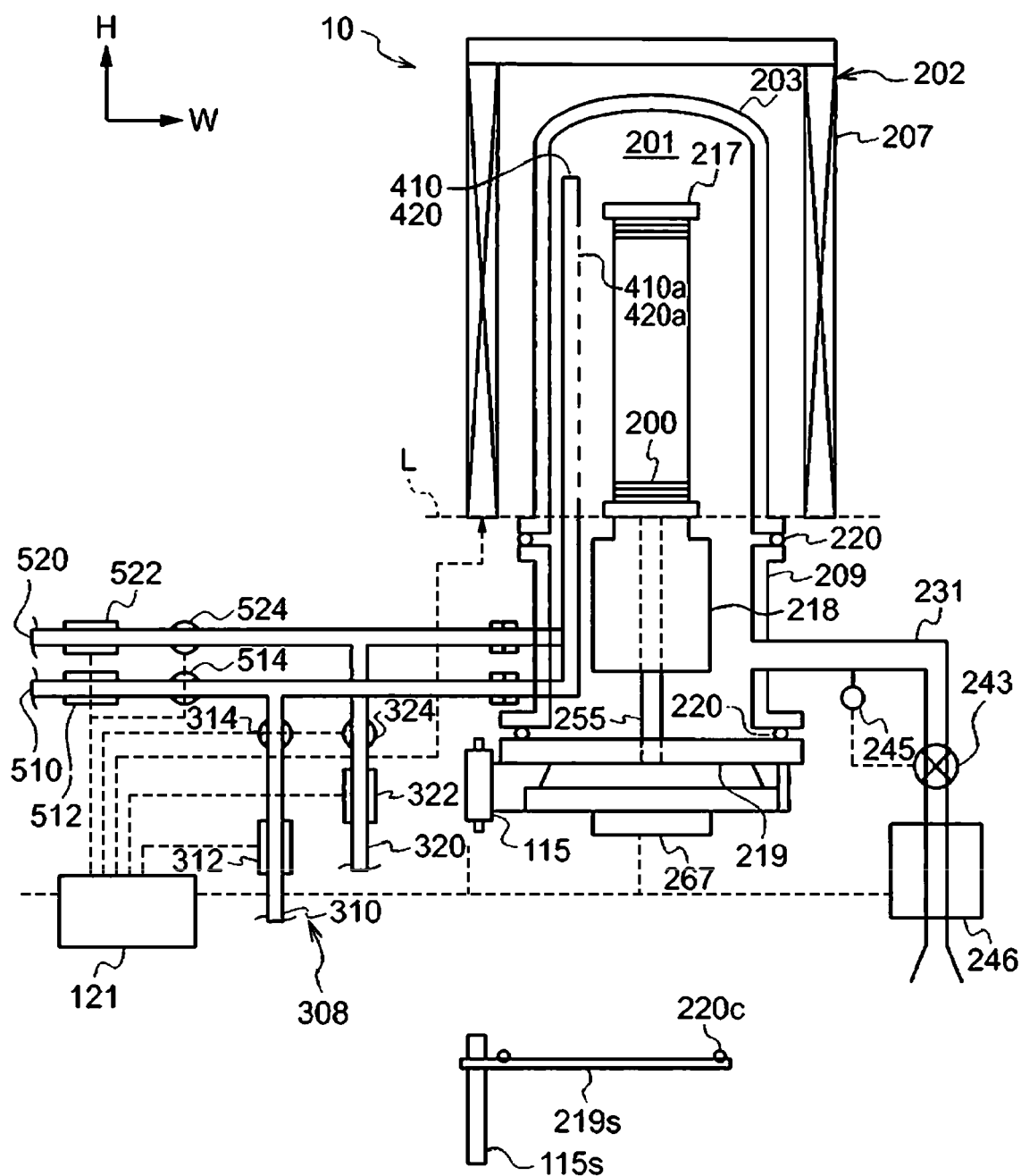
FIG. 3 is a schematic configuration diagram showing the substrate processing apparatus according to the embodiment of the present disclosure.

As shown in FIG. 3, the substrate processing apparatus 10 including a liquid precursor replenishment system includes a process furnace 202 for processing a wafer 200 as a substrate. The process furnace 202 includes a cylindrical heater 207 extending in the vertical direction of the apparatus. The heater 207 is supported by a heater base (not shown) as a holding plate. Then, the heater 207 is configured to heat the interior of a below-described process chamber 201 to a predetermined temperature.

Figure 2:
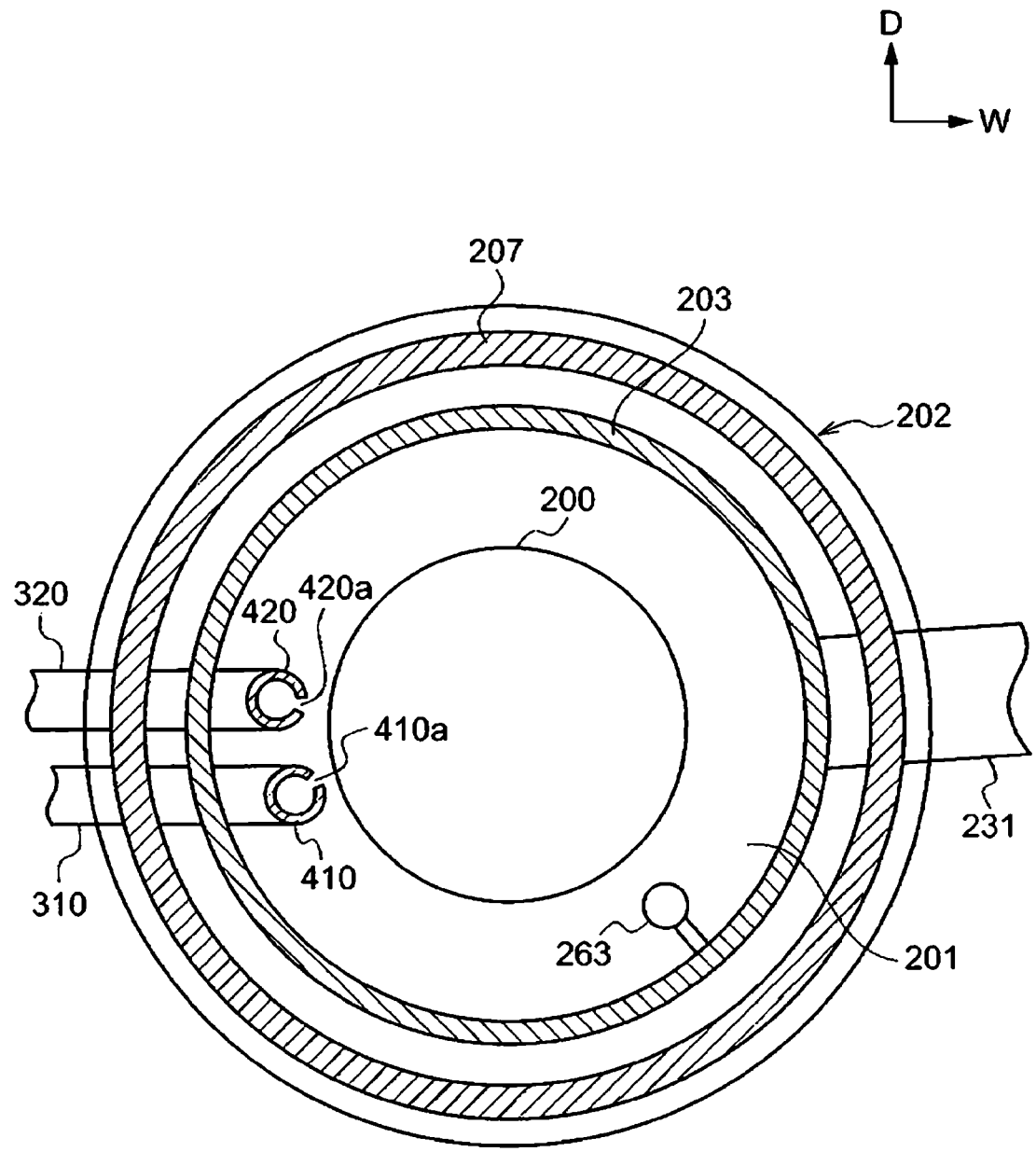
FIG. 2 is a sectional view showing a process chamber and the like included in the substrate processing apparatus according to the embodiment of the present disclosure.

Furthermore, as shown in FIGS. 2 and 3, a process tube 203 as a process part having a cylindrical shape concentric with the heater 207 is disposed inside the heater 207. The process tube 203 is made of a heat-resistant material such as, for example, quartz ($SiO_2$) or silicon carbide (SiC). An upper end of the process tube 203 is closed and a lower end thereof is opened. A process chamber 201 for processing a plurality of wafers 200 is formed inside the process tube 203. More specifically, a plurality of (for example, 25 to 200) wafers 200 are stacked in the vertical direction on a boat 217 as a substrate support tool. The wafers 200 stacked on the boat 217 are disposed in the process chamber 201. The boat 217 is made of a heat-resistant material such as, for example, quartz or SiC. A cylindrical heat insulating tube 218 made of a heat-resistant material such as quartz or SiC is disposed under the boat 217. With this configuration, the heat generated from the heater 207 is less likely to be transmitted to the side of a seal cap 219 to be described later.

Furthermore, as shown in FIG. 3, a manifold (inlet flange) 209 having a cylindrical shape concentric with the process tube 203 is disposed below the process tube 203. The manifold 209 is made of a metal such as, for example, stainless steel (SUS) or the like. The upper end and the lower end of the manifold 209 are opened. The upper end of the manifold 209 faces the lower end of the process tube 203. The manifold 209 supports the process tube 203 via an O-ring 220 as a sealing member.

In the process chamber 201, nozzles 410 and 420 extending in the vertical direction are disposed between the wall surface of the process tube 203 and the plurality of wafers 200 stacked on the boat 217. Furthermore, in the nozzles 410 and 420, a plurality of supply holes 410a and 420a for supplying a gas are formed over a range where the nozzles 410 and 420 are opposed to the wafers 200 in the horizontal direction. As a result, the gas ejected from the supply holes 410a and 420a flows toward the wafers 200.

Moreover, a lower end side portions of the nozzles 410 and 420 are bent to penetrate a side wall of the manifold 209, and the lower ends of the nozzles 410 and 420 protrude toward an outside of the manifold 209. Gas supply pipes 310 and 320 as gas supply lines are connected to the lower ends of the nozzles 410 and 420, respectively. As a result, plural types of gases are supplied to the process chamber 201.

In the gas supply pipes 310 and 320, mass flow controllers (MFCs) 312 and 322, which are flow rate controllers (flow rate control parts), and valves 314 and 324, which are opening/closing valves, are installed sequentially from the upstream side in a flow direction (hereinafter referred to as "gas flow direction") of the gas flowing through the gas supply pipes 310 and 320. Furthermore, end portions of gas supply pipes 510 and 520 as gas supply lines for supplying an inert gas are respectively connected to the gas supply pipes 310 and 320 on a downstream side of the valves 314 and 324 in the gas flow direction. In the gas supply pipes 510 and 520, MFCs 512 and 522, which are flow rate controllers (flow rate control parts), and valves 514 and 524, which are opening/closing valves, are installed sequentially from the upstream side in the flow direction of the gas flowing through the gas supply pipes 510 and 520.

From the gas supply pipe 310, a precursor gas as a processing gas is supplied to the process chamber 201 via the MFC 312, the valve 314 and the nozzle 410. As described above, the supply part 308 for supplying the precursor gas to the process chamber 201 is configured to include the gas supply pipe 310, the MFC 312, the valve 314 and the nozzle 410.

As the precursor gas, for example, trimethylaluminum ($Al(CH_3)_3$, abbreviation: TMA) as an aluminum-containing precursor (Al-containing precursor gas or Al-containing gas) which is a metal-containing gas containing aluminum as a metal element is used. TMA is an organic precursor and is an alkyl aluminum having an alkyl group bonded as a ligand to aluminum.

The precursor gas is a gaseous precursor, for example, a gaseous precursor kept in a gaseous state under a room temperature and an atmospheric pressure, or a gas obtained by vaporizing a liquid precursor kept in a liquid state under the room temperature and the atmospheric pressure.

In the case of supplying a precursor gas self-decomposed at a predetermined temperature from the gas supply pipe 310, a precursor gas supply system is mainly constituted by the gas supply pipe 310, the MFC 312 and the valve 314. The nozzle 410 may be included in the precursor gas supply system. The precursor gas supply system may also be referred to as a precursor supply system. In the case of supplying a metal-containing gas from the gas supply pipe 310, the precursor gas supply system may be referred to as a metal-containing gas supply system.

When an aluminum-containing raw material (Al-containing precursor gas or Al-containing gas) is used as the metal-containing gas, the metal-containing gas supply system may also be referred to as an aluminum-containing precursor (Al-containing precursor gas or Al-containing gas) supply system. In the case of using TMA as the aluminum-containing precursor, the aluminum-containing precursor supply system may also be referred to as a TMA supply system.

On the other hand, from the gas supply pipe 320, a reaction gas as a processing gas is supplied to the process chamber 201 via the MFC 322, the valve 324 and the nozzle 420. As the reaction gas, for example, an oxygen-containing gas (oxidizing gas or oxidizing agent) as a reaction gas (reactant) containing oxygen (O) and reacting with Al is used.

In the case of supplying the reactant gas (reactant) from the gas supply pipe 320, a reaction gas supply system (reactant supply system) is mainly constituted by the gas supply pipe 320, the MFC 322 and the valve 324. The nozzle 420 may be included in the reaction gas supply system. In the case of supplying an oxygen-containing gas (oxidizing gas or oxidizing agent) as the reaction gas, the reaction gas supply system may also be referred to as an oxygen-containing gas (oxidizing gas or oxidizing agent) supply system. In the case of using $O_3$ as the oxygen-containing gas, the oxygen-containing gas supply system may also be referred to as an $O_3$ supply system. In the case of supplying the reaction gas from the nozzle 420, the nozzle 420 may be referred to as a reaction gas nozzle.

Furthermore, from the gas supply pipes 510 and 520, an inert gas is supplied to the process chamber 201 via the MFCs 512 and 522, the valves 514 and 524 and the nozzles 410 and 420. As the inert gas, for example, an $N_2$ gas is used.

The inert gas supply system is mainly constituted by the gas supply pipes 510 and 520, the MFCs 512 and 522 and the valves 514 and 524.

Meanwhile, one end of an exhaust pipe 231 as an exhaust flow path for exhausting the atmosphere of the process chamber 201 is connected to the wall surface of the manifold 209. A pressure sensor 245 serving as a pressure detector (pressure detection part) for detecting a pressure in the process chamber 201 and an APC (Auto Pressure Controller) valve 243 as an exhaust valve (pressure regulation part) are attached to the exhaust pipe 231. A vacuum pump 246 as a vacuum evacuation device is attached to an end portion of the exhaust pipe 231.

The APC valve 243 may be configured so that, by opening and closing the APC valve 243 while operating the vacuum pump 246, it is possible to perform vacuum evacuation and vacuum evacuation stop of the process chamber 201 and so that, by adjusting the valve opening degree based on the pressure information detected by the pressure sensor 245 while operating the vacuum pump 246, it is possible to regulate a pressure in the process chamber 201. An exhaust system is mainly constituted by the exhaust pipe 231, the APC valve 243 and the pressure sensor 245. The vacuum pump 246 may be included in the exhaust system. The exhaust pipe 231 is not limited to being installed in the process pipe 203 and may be installed in the manifold 209 in the same manner as the nozzles 410 and 420.

A seal cap 219 as a furnace port lid capable of airtightly closing the lower end opening of the manifold 209 is installed below the manifold 209. The seal cap 219 is configured to come into contact with the lower end of the manifold 209 from the lower side in the vertical direction. The seal cap 219 is made of a metal such as, for example, stainless steel or the like, and has a disc shape. On an upper surface of the seal cap 219, there is installed an O-ring 220 as a seal member which comes into contact with the lower end of the manifold 209. On the opposite side of the seal cap 219 from the process chamber 201, there is installed a rotation mechanism 267 for rotating a boat 217 to be described later. A rotating shaft 255 of the rotation mechanism 267 is installed to extend through the seal cap 219 and is connected to the boat 217. The rotation mechanism 267 is configured to rotate the wafers 200 by rotating the boat 217.

The seal cap 219 is configured to be raised and lowered in the vertical direction by a boat elevator 115 as an elevating mechanism installed vertically outside the process tube 203. The boat elevator 115 is configured so that the boat 217 can be carried into and out of the process chamber 201 by moving the seal cap 219 up and down. The boat elevator 115 is configured as a transfer device (conveying mechanism) that transfers the boat 217, i.e., the wafers 200, into and out of the process chamber 201. A shutter 219s as a furnace port lid capable of airtightly closing the lower end opening of the manifold 209 while lowering the seal cap 219 by the boat elevator 115 is installed below the manifold 209. The shutter 219s is made of a metal such as, for example, stainless steel or the like, and has a disc shape. On the upper surface of the shutter 219s, there is installed an O-ring 220c as a sealing member which comes in contact with the lower end of the manifold 209. The opening/closing operation (elevating operation, rotating operation, etc.) of the shutter 219s is controlled by a shutter opening/closing mechanism 115s.

As shown in FIG. 2, a temperature sensor 263 as a temperature detector is disposed in the process chamber 201. By adjusting a current conduction condition to the heater 207 based on the temperature information detected by the temperature sensor 263, the temperature of the process chamber 201 is controlled to have a desired temperature distribution. Just like the nozzles 410 and 420, the temperature sensor 263 is installed along the inner wall of the process tube 203.

Figure 4:
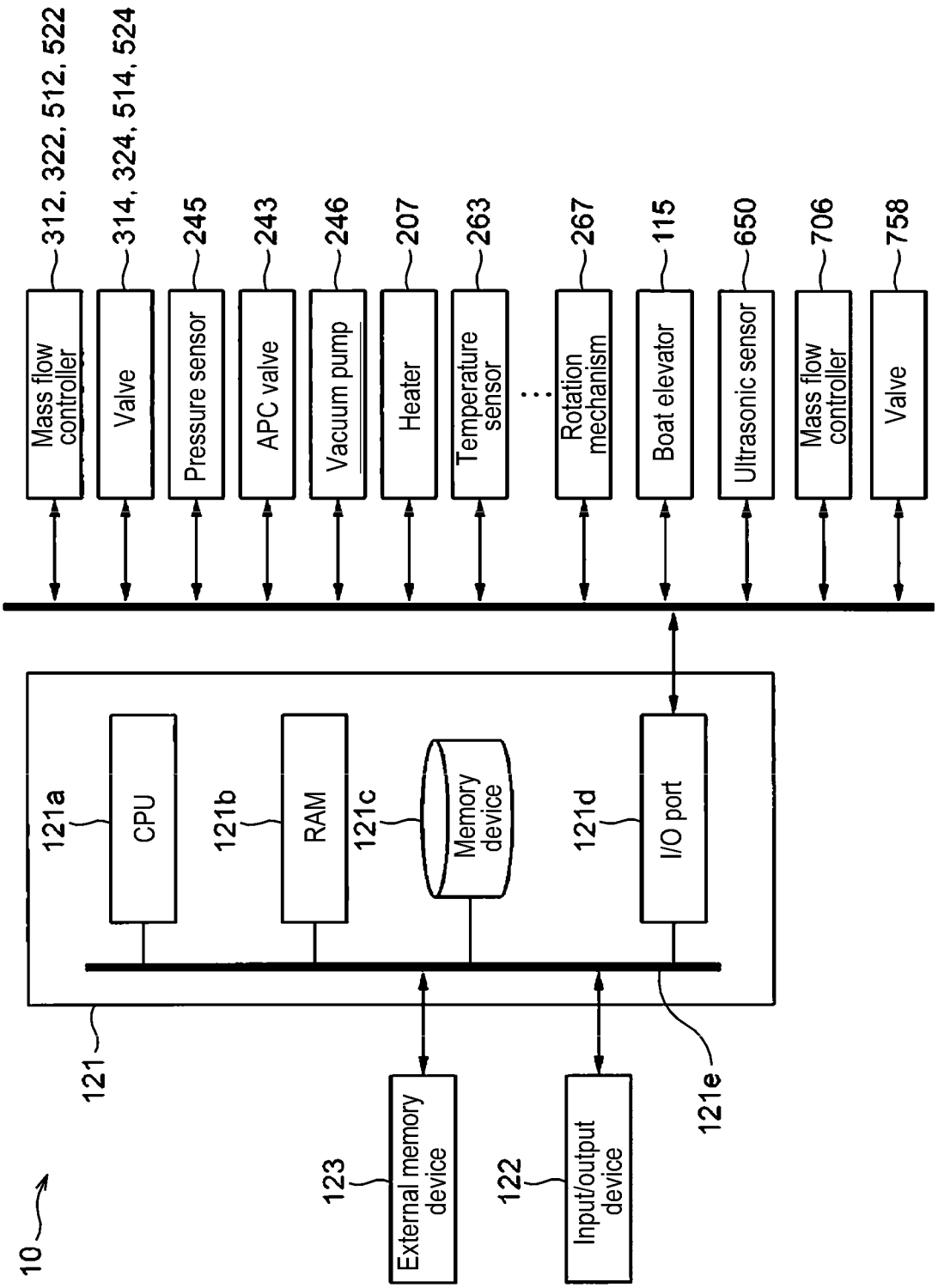
FIG. 4 is a block diagram for explaining a controller included in the substrate processing apparatus according to the embodiment of the present disclosure.

Next, a controller 121 as a controller included in the substrate processing apparatus 10 will be described. As shown in FIG. 4, the controller 121 is configured as a computer including a CPU (Central Processing Unit) 121a, a RAM (Random Access Memory) 121b, a memory device 121c and an I/O port 121d. The RAM 121b, the memory device 121c and the I/O port 121d are configured to exchange data with the CPU 121a via an internal bus 121e. An input/output device 122 configured as, for example, a touch panel or the like, is connected to the controller 121.

The memory device 121c is configured by, for example, a flash memory, a hard disc drive (HDD), or the like. A control program for controlling the operations of the substrate processing apparatus, and the like are readably stored in the memory device 121c.

The RAM 121b is configured as a memory area (work area) in which a program or data read by the CPU 121a is temporarily stored.

The I/O port 121d is connected to the MFCs 512, 522, 312 and 322, the valves 514, 524, 314 and 324, the pressure sensor 245, the APC valve 243, the vacuum pump 246, the temperature sensor 263, the heater 207, the rotation mechanism 267, the boat elevator 115, the shutter opening/closing mechanism 115s, a below-described ultrasonic sensor 650, a below-described MFC 706, a below-described valve 758, and the like.

The CPU 121a is configured to read the control program from the memory device 121c and execute the same. The CPU 121a is also configured to read data from the memory device 121c according to an input of an operation command from the input/output device 122.

The CPU 121a is configured to control, according to the contents of data thus read, a flow rate adjustment operation of various gases performed by the MFCs 512, 522, 312 and 322, opening and closing operations of the valves 514, 524, 314 and 324, opening and closing operations of the APC valve 243, a pressure regulation operation performed by the APC valve 243 based on the pressure sensor 245, a startup and stoppage of the vacuum pump 246, a temperature adjustment operation of the heater 207 based on the temperature sensor 263, rotation and rotation speed adjustment operations of the boat 217 performed by the rotation mechanism 267, an elevating operation of the boat 217 performed by the boat elevator 115, an opening and closing of the shutter 219s performed by the shutter opening/closing mechanism 115s, and the like.

The controller 121 may be configured by installing, in a computer, the program stored in an external memory device (e.g., a magnetic tape, a magnetic disk such as a flexible disk, a hard disk or the like, an optical disk such as a CD, a DVD or the like, a magneto-optical disk such as an MO or the like, or a semiconductor memory such as a USB memory, a memory card or the like) 123.

The memory device 121c or the external memory device 123 is configured as a non-transitory computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123. The provision of the program to the computer may be performed by using a communication means such as the Internet or a dedicated line without using the external memory device 123.

The control of the ultrasonic sensor 650, the MFC 706 and the valve 758 by the controller 121 will be described later together with the operations thereof.

(Configuration of Main Part)
[Storage Tank]

Next, a storage tank 610 for storing a liquid precursor (TMA) which becomes a precursor gas (TMA gas) by vaporization will be described.

The storage tank 610 has a rectangular parallelepiped shape. As shown in FIG. 1, the storage space 612 formed inside the storage tank 610 is defined by a bottom portion 620, a plurality of wall portions 630 extending upward from a peripheral edge of the bottom portion 620, and a ceiling portion 640 for closing the storage space 612 surrounded by the plurality of wall portions 630 from the upper side. The storage space 612 is a space hermetically sealed from the outside. The storage space 612 is set at a predetermined pressure. In addition, the lower end portion of the gas supply pipe 310 described above is disposed in the storage space 612 through the ceiling portion 640.

The bottom portion 620 has a bottom surface 622 facing upward. A recess 624 in which a part of the bottom surface 622 is recessed is formed in a central portion of the bottom surface 622 in an apparatus width direction and an apparatus depth direction. The recess 624 extends in the vertical direction and has a rectangular cross section.

A lower limit set value for the liquid precursor in the present embodiment is higher (larger) than a storable lower limit value at which the liquid precursor can be stored in the storage space 612 (see figures). In addition, an upper limit set value for the liquid precursor in the present embodiment is lower (smaller) than a storable upper limit value at which the liquid precursor can be stored in the storage space 612 (see figures).

The reason why the lower limit set value is made higher than the storable lower limit value is that, while achieving the lower limit value for the ultrasonic sensor 650 to accurately monitor a liquid level, it is possible to prevent the precursor from becoming insufficient even when film formation is performed from the lower limit value. In addition, the use amount required for performing film formation once is set as the upper limit set value. The upper limit set value is made lower than the storable upper limit value in order not to affect the apparatus even if the liquid level exceeds the upper limit set value. In this regard, when the upper limit set value is set to the use amount required for performing film formation once, refilling is performed for every batch. It is sometimes necessary to perform refilling twice.

[Ultrasonic Sensor]

An ultrasonic sensor 650 is disposed in the storage space 612 to extend in the vertical direction, and the upper end thereof is attached to the ceiling portion 640. The cross-sectional shape of the ultrasonic sensor 650 is a rectangular shape smaller than the cross-sectional shape of the recess 624. The lower portion of the ultrasonic sensor 650 is disposed in the recess 624. A sensor element 652 is attached to the lower end portion of the ultrasonic sensor 650.

In this configuration, the ultrasonic wave generated by the sensor element 652 is reflected on the liquid surface of the liquid precursor. The wave receiving portion (not shown) of the ultrasonic sensor 650 receives the reflected wave, whereby the ultrasonic sensor 650 continuously detects the liquid level of the liquid precursor stored in the storage tank 610. In this way, the ultrasonic sensor 650 functions as a continuous sensor (also referred to as a continuous type sensor, a continuous type level sensor, or a continuous liquid level sensor).

[Vaporizing Part]

A vaporizing part 700 is a device that vaporizes the liquid precursor stored in the storage tank 610 into a precursor gas by a bubbling method. The vaporizing part 700 includes a gas supply pipe 704 through which a carrier gas flows, and a mass flow controller (MFC) 706.

The gas supply pipe 704 extends through the ceiling portion 640. One end of the gas supply pipe 704 is disposed in the liquid precursor stored in the storage tank 610. The MFC 706 is installed in the portion of the gas supply pipe 704 disposed outside the storage tank 610.

In this configuration, the carrier gas whose flow rate is adjusted by the MFC 706 is supplied to the liquid precursor from one end of the gas supply pipe 704. Then, the carrier gas acts on the liquid precursor so that the liquid precursor is vaporized.

In the bubbling method, it is possible to control the supply amount of the carrier gas (for example, an $N_2$ gas) supplied to the storage tank 610 (bubbler). However, the actual vaporization amount cannot be grasped. Therefore, in the present embodiment, the vaporization amount is grasped by detecting a decrease amount of the liquid precursor using the ultrasonic sensor 650 described above.

[Replenishment Part]

The replenishment part 750 is a device that replenishes the liquid precursor to the storage tank 610 by a so-called auto refill system (ARS). The replenishment part 750 includes a liquid supply pipe 754 through which the liquid precursor flows, a valve 758 which is an opening/closing valve, and a replenishment tank 760 in which the liquid precursor to be replenished is stored.

The liquid supply pipe 754 extends through the ceiling portion 640, and one end thereof is disposed in the storage space 612. The replenishment tank 760 is disposed outside the storage tank 610 and is connected to the other end of the liquid supply pipe 754. The valve 758 is installed in the portion of the liquid supply pipe 754 disposed outside the storage tank 610.

In this configuration, the liquid precursor always remains in the portion of the liquid supply pipe 754 between the replenishment tank 760 and the valve 758. Then, by opening the valve 758 which is closed, the replenishment part 750 replenishes the liquid precursor to the storage tank 610.

(Operation)

Next, a method of manufacturing a semiconductor device using the substrate processing apparatus 10 will be described. The operations of the respective parts constituting the substrate processing apparatus 10 are controlled by the controller 121.

Figure 5:
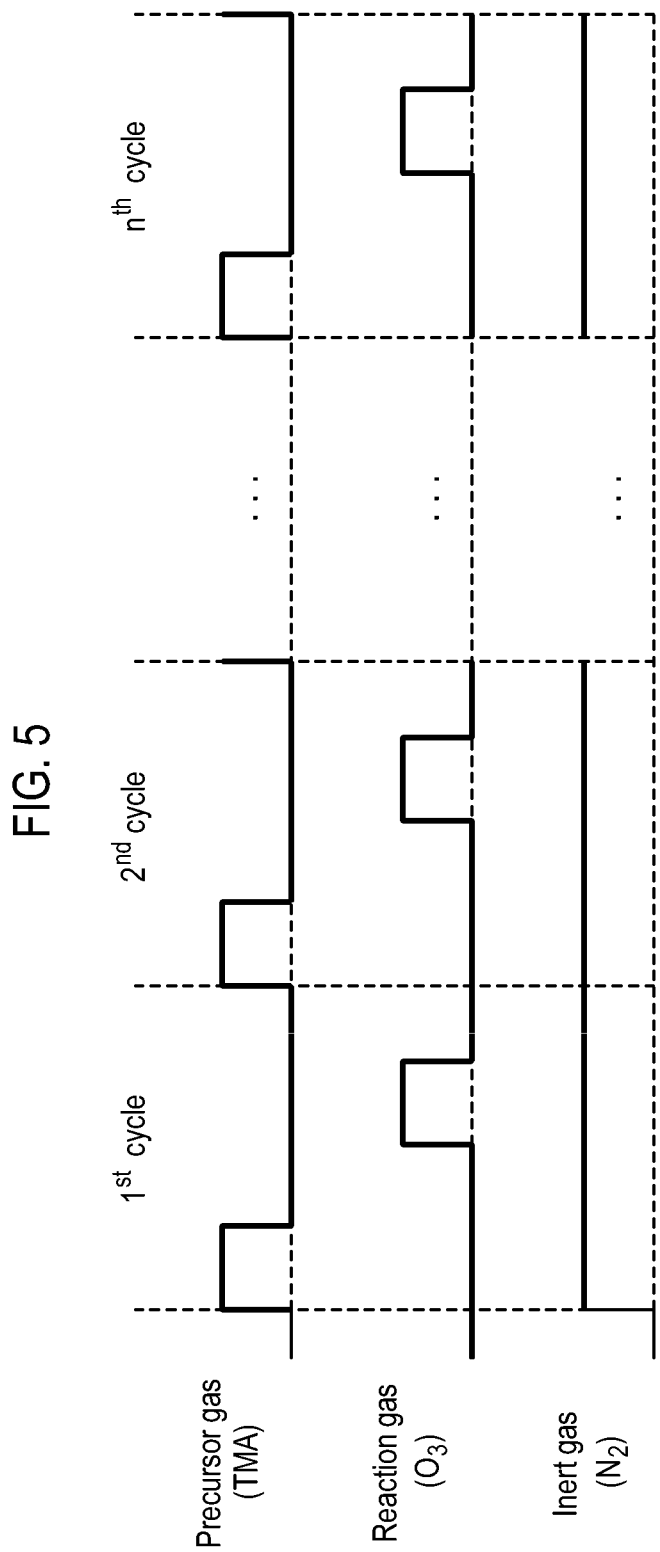
FIG. 5 is a view showing a film-forming sequence when a film-forming process is performed on a wafer using the substrate processing apparatus according to the embodiment of the present disclosure.

First, a sequence example of forming a film on the wafer 200 using the substrate processing apparatus 10 will be described with reference to FIG. 5. In the present embodiment, the process chamber 201 accommodating a plurality of wafers 200 in a stacked state is heated to a predetermined temperature. Then, a precursor gas supply step of supplying a TMA gas as a precursor gas from the supply holes 410a of the nozzle 410 to the process chamber 201 and a reaction gas supply step of supplying an $O_3$ gas as a reaction gas from the supply holes 420a of the nozzle 420 to the process chamber 201 are performed a predetermined number of times (n times). As a result, an aluminum oxide film (AlO film) as a film containing Al and O is formed on the wafer 200.

Hereinafter, a method of manufacturing a semiconductor device will be described in detail.

[Charging/Loading]

First, a plurality of wafers 200 are charged on the boat 217 (wafer charging). The shutter 219s is moved by the shutter opening/closing mechanism 115s to open a lower end opening of the manifold 209 (shutter opening). As shown in FIG. 3, the boat 217 charged with the plurality of wafers 200 is lifted by the boat elevator 115 and is loaded into the process chamber 201 (boat loading). In this state, the seal cap 219 seals a lower end of the manifold 209 via an O-ring 220b.

[Pressure Regulation/Temperature Adjustment]

Next, vacuum evacuation is performed by the vacuum pump 246 so that the process chamber 201 has a desired pressure (degree of vacuum). At this time, the pressure in the process chamber 201 is measured by the pressure sensor 245, and the APC valve 243 is feedback-controlled based on the measured pressure information (pressure regulation). The vacuum pump 246 is kept operated at least until the processing on the wafer 200 is completed.

In addition, the heater 207 heats the process chamber 201 so as to have a desired temperature. At this time, based on the temperature information detected by the temperature sensor 263 (see FIG. 2), an amount of electric power supplied to the heater 207 is feedback-controlled so that the process chamber 201 has a desired temperature distribution (temperature adjustment). The heating of the process chamber 201 by the heater 207 is continued at least until the processing on the wafer 200 is completed.

Furthermore, the boat 217 and the wafer 200 are rotated by the rotation mechanism 267. The rotation of the boat 217 and the wafer 200 by the rotation mechanism 267 is continued at least until the processing on the wafer 200 is completed.

[Adjustment of Liquid Precursor Amount (One Example of Storage Step)]

Next, the liquid precursor is stored in the storage tank 610 so that the liquid level of the liquid precursor stored in the storage tank 610 shown in FIG. 1 becomes a predetermined initial liquid level. In the present embodiment, the initial liquid level refers to a liquid level available when a total sum of a minimum liquid precursor amount required for the ultrasonic sensor 650 to detect the liquid level and a liquid precursor amount required for performing a below-described film-forming process a predetermined number of times (by one batch) is stored in the storage tank 610.

The minimum liquid precursor amount required for the ultrasonic sensor 650 to detect the liquid level is the amount when the liquid level is located at the lower limit value of the storage tank 610.

In addition, the liquid precursor amount required for performing a film-forming process a predetermined number of times is the amount required for forming an AlO film on the wafer 200 by performing, a predetermined number of times (one or more times), a cycle in which a precursor gas supply step, a residual gas removal step, a reaction gas supply step and a residual gas removal step, which will be described later, are performed in order.

Hereinafter, the adjustment of the liquid precursor amount will be specifically described.

The controller 121 detects the liquid level of the liquid precursor by the ultrasonic sensor 650. If the liquid level of the liquid precursor does not reach the initial liquid level, the controller 121 opens the closed valve 758 so that the replenishment part 750 replenishes the liquid precursor in the storage tank 610. If the liquid level of the liquid precursor detected by the ultrasonic sensor 650 reaches the initial liquid level, the controller 121 closes the opened valve 758, thereby terminating the adjustment of the liquid precursor amount.

The liquid precursor is not replenished in the storage tank 610 by the replenishment part 750 so as to be at a higher level than the initial liquid level. Therefore, the liquid level at the time initially detecting the liquid level of the liquid precursor with the ultrasonic sensor 650 is not higher than the initial liquid level.

[Film-Forming Process (One Example of Substrate Processing)]

[Vaporizing Step]

The liquid precursor stored in the storage tank 610 is vaporized into a precursor gas.

Specifically, the amount of the precursor gas required in a precursor gas supply step to be described later is stored in advance in the controller 121. The controller 121 controls the MFC 706 of the vaporizing part 700 to supply a carrier gas to the liquid precursor stored in the storage tank 610. Thus, the liquid precursor is vaporized into a precursor gas.

[Precursor Gas Supply Step (One Example of Processing Step)]

Next, the valve 314 shown in FIG. 3 is opened to allow the precursor gas (TMA gas) to flow into the gas supply pipe 310. The flow rate of the precursor gas is adjusted by the MFC 312. The precursor gas is supplied to the process chamber 201 from the supply holes 410a of the nozzle 410. At the same time, the valve 514 is opened to allow a carrier gas ($N_2$ gas) to flow into the gas supply pipe 510. The flow rate of the carrier gas is adjusted by the MFC 512. The carrier gas is supplied together with the precursor gas into the process chamber 201 from the supply holes 410a of the nozzle 410 and is exhausted from the exhaust pipe 231.

In order to prevent the precursor gas from entering the nozzle 420 (from flowing backward), the valve 524 is opened to allow the carrier gas to flow into the gas supply pipe 520. The carrier gas is supplied to the process chamber 201 via the gas supply pipe 520 and the nozzle 420 and is exhausted from the exhaust pipe 231.

At this time, the APC valve 243 is properly adjusted to set the pressure in the process chamber 201 to a pressure falling within a range of, for example, 1 to 1000 Pa. In this specification, when a range of numerical values is described to read, for example, 1 to 1000 Pa, it means 1 Pa or more and 1000 Pa or less. That is, 1 Pa and 1000 Pa are included in the range of numerical values. This applies to all numerical values described in this specification, such as a flow rate, a time, a temperature and the like as well as the pressure.

The supply flow rate of the precursor gas controlled by the MFC 312 is set to a flow rate falling within a range of, for example, 10 to 2000 sccm, preferably 50 to 1000 sccm, more preferably 100 to 500 sccm.

By setting the flow rate to 2,000 sccm or less, it is possible to suitably perform the residual gas removal to be described later and it is possible to prevent the precursor gas from being self-decomposed in the nozzle 410 and accumulating on the inner wall of the nozzle 410. By setting the flow rate to 10 sccm or more, it is possible to obtain a practical deposition rate that can increase the reaction rate of the precursor gas on the surface of the wafer 200.

The supply flow rate of the carrier gas controlled by the MFC 512 is set to a flow rate falling within a range of, for example, 1 to 30 slm.

The time for supplying the precursor gas to the wafer 200 is set to a time falling within a range of, for example, 1 to 60 seconds.

The heater 207 performs heating so that the temperature of the wafer 200 becomes a temperature falling within a range of, for example, 400 to 600 degrees C., 400 to 550 degrees C. in some embodiments, and 450 to 550 degrees C. in some embodiments.

By setting the temperature at 600 degrees C. or lower, it is possible to appropriately obtain a deposition rate while suppressing excessive thermal decomposition of the precursor gas, thereby suppressing an entry of impurities into a film and an increase in resistivity. Since the thermal decomposition of the precursor gas starts at about 450 degrees C. under conditions close to the processing, it is more effective to implement the present disclosure in the process chamber 201 heated to a temperature of 550 degrees C. or lower. On the other hand, when the temperature is 400 degrees C. or higher, the reactivity is high, which enables efficient film formation.

By supplying the precursor gas to the process chamber 201 under the above-described conditions, an Al-containing layer containing C and H and having a thickness of, for example, less than one atomic layer to several atomic layers is formed on the outermost surface of the wafer 200. The Al-containing layer containing C and H may be an Al layer containing C and H, an adsorption layer of TMA, or both.

The adsorption layer of TMA may be a physical adsorption layer of TMA, a chemical adsorption layer of TMA, or both. As used herein, the layer having a thickness of less than one atomic layer means an atomic layer which is discontinuously formed, and the layer having a thickness of one atomic layer is an atomic layer which is continuously formed.

[Residual Gas Removal Step (One Example of Processing Step)]

After forming the Al-containing layer, the valve 314 is closed to stop the supply of the precursor gas. At this time, while keeping the APC valve 243 opened, the process chamber 201 is evacuated into vacuum by the vacuum pump 246, whereby the precursor gas unreacted or contributed to the formation of the Al-containing layer, which remains in the process chamber 201, is removed from the process chamber 201. The valves 514 and 524 are kept opened to maintain the supply of the carrier gas to the process chamber 201. The carrier gas acts as a purge gas and can enhance the effect of removing the precursor gas unreacted or contributed to the formation of the Al-containing layer, which remains in the process chamber 201, from the process chamber 201. The carrier gas from the valves 514 and 524 may be kept flowing continuously or may be intermittently supplied (like a pulse) during the residual gas removal step.

[Reaction Gas Supply Step (One Example of Processing Step)]

After the residual gas in the process chamber 201 is removed, the valve 324 is opened to allow a reaction gas ($O_3$ gas) to flow into the gas supply pipe 320. The flow rate of the reaction gas is adjusted by the MFC 322. The reaction gas is supplied to the wafer 200 in the process chamber 201 from the supply holes 420a of the nozzle 420 and is exhausted from the exhaust pipe 231. That is, the wafer 200 is exposed to the reaction gas.

At this time, the valve 524 is opened to allow the carrier gas to flow into the gas supply pipe 520. The flow rate of the carrier gas is adjusted by the MFC 522. The carrier gas is supplied into the process chamber 201 together with the reaction gas and is exhausted from the exhaust pipe 231. At this time, in order to prevent entry of the reaction gas into the nozzle 410 (prevent backflow of the reaction gas), the valve 514 is opened to allow the carrier gas to flow into the gas supply pipe 510. The carrier gas is supplied into the process chamber 201 via the gas supply pipe 510 and the nozzle 410 and is exhausted from the exhaust pipe 231.

At this time, the APC valve 243 is properly adjusted to set the pressure in the process chamber 201 to a pressure falling within a range of, for example, 1 to 1000 Pa. The supply flow rate of the reaction gas controlled by the WC 322 is set to a flow rate falling within a range of, for example, 5 to 40 slm, 5 to 30 slm in some embodiments, and 10 to 20 slm in some embodiments. The time for supplying the reaction gas to the wafer 200 is set to a time falling within a range of, for example, 1 to 60 seconds. Other processing conditions are the same as the processing conditions of the above-described precursor gas supply step.

At this time, only the reaction gas and the inert gas ($N_2$ gas) are flowing into the process chamber 201. The reaction gas reacts with at least a part of the Al-containing layer formed on the wafer 200 in the precursor gas supply step. The Al-containing layer is oxidized. Thus, an aluminum oxide layer (AlO layer) containing Al and O is formed as a metal oxide layer. That is, the Al-containing layer is modified into an AlO layer.

[Residual Gas Removal Step (One Example of Processing Step)]

After the AlO layer is formed, the valve 324 is closed to stop the supply of the reaction gas. The reaction gas unreacted or contributed to the formation of the AlO layer and reaction byproducts, which remain in the process chamber 201, are removed from the process chamber 201 through the same processing procedure as that of the residual gas removal step performed after the precursor gas supply step.

A cycle of sequentially performing the vaporizing step, the precursor gas supply step, the residual gas removal step, the reaction gas supply step and the residual gas removal step described above is performed a predetermined number of times (one or more times). As described above, an AlO film is formed on the wafer 200 by performing a batch process (by performing a plurality of processes a plurality of times).

The batch process is a process in which an AlO film is formed on the wafer 200 by performing, a predetermined number of times, a cycle of sequentially performing the vaporizing step, the precursor gas supply step, the residual gas removal step, the reaction has supply step and the residual gas removal step. Then, in one batch, an AlO film is formed on the wafer 200.

A thickness (film thickness) of the AlO film is, for example, 10 to 150 nm, 40 to 100 nm in some embodiments, and 60 to 80 nm in some embodiments. By setting the thickness to 150 nm or less, it is possible to reduce a surface roughness. By setting the thickness to 10 nm or more, it is possible to suppress occurrence of film peeling due to a stress difference between the AlO film and an underlying film.

[Replenishment Step]

As described above, the AlO film is formed on the wafer 200 by subjecting the wafer 200 to the batch process. Since the liquid precursor stored in the storage tank 610 is consumed, the liquid level of the liquid precursor in the storage tank 610 becomes lower than the initial liquid level.

Therefore, the controller 121 obtains the liquid level of the liquid precursor detected by the ultrasonic sensor 650 shown in FIG. 1. Furthermore, the controller 121 opens the closed valve 758 so that the replenishment part 750 replenishes the liquid precursor into the storage tank 610. When the liquid level of the liquid precursor detected by the ultrasonic sensor 650 reaches the initial liquid level, the controller 121 closes the opened valve 758, thereby terminating the replenishment step.

[Exhaust and Pressure Regulation]

After the AlO layer is formed and the residual gas removal step is completed, the valves 514 and 524 shown in FIG. 3 are opened. Thus, the carrier gas is supplied from the gas supply pipes 310 and 320 to the process chamber 201 and is exhausted from the exhaust pipe 231. The carrier gas acts as a purge gas, whereby the gas or the by-products remaining in the process chamber 201 are removed from the process chamber 201 (after-purge). Thereafter, the atmosphere in the process chamber 201 is replaced with the carrier gas ($N_2$ gas replacement), and the pressure in the process chamber 201 is restored to the atmospheric pressure (atmospheric pressure restoration).

[Unloading/Discharging]

Thereafter, the seal cap 219 is lowered by the boat elevator 115, the lower end of the manifold 209 is opened, and the processed wafers 200 are unloaded from the lower end of the manifold 209 to the outside of the process tube 203 while being supported by the boat 217 (boat unloading).

After the processed wafers 200 are unloaded, the shutter 219s is moved so that the lower end opening of the manifold 209 is sealed by the shutter 219s via the O ring 220c (shutter closing). The processed wafers 200 unloaded to the outside of the process tube 203 are discharged from the boat 217 (wafer discharging).

In the case where an AlO film is formed on another wafer 200 after discharging the wafer 200 on which the AlO film is formed through the respective processes (steps) as described above, the "charging/loading", the "pressure regulation/temperature adjustment", the "film-forming process", the "exhaust/pressure regulation" and the "unloading/discharging" are performed again except for the aforementioned "adjustment of liquid precursor amount." That is, a batch process on the wafer 200 is performed again.

[Others]

Thereafter, a pattern forming process, a dicing process, a wire bonding process, a molding process, a trimming process and the like, which are known in the art, are performed on the wafer 200 on which the AlO film is formed. Thus, a semiconductor device is manufactured.

SUMMARY

As described above, every time when the wafer 200 is subjected to a batch process, the liquid precursor is replenished in the storage tank 610 by the replenishment part 750 (every batch refilling). As a result, the amount of the liquid precursor stored in the storage tank 610 falls within a predetermined range. In other words, by replenishing the liquid precursor just as much as the reduced amount, the amount of the liquid precursor stored in the storage tank 610 becomes constant (the liquid level becomes constant) when subjecting the wafer 200 to a film-forming process. As a result, a variation in concentration of impurities contained in the precursor gas is suppressed. This makes it possible to suppress the variations in the in-plane uniformity value of the film formed on the wafer 200.

In the above-described embodiment, the liquid level is detected by the ultrasonic sensor 650 to determine the amount of the liquid precursor stored in the storage tank 610. Conventionally, the amount of the liquid precursor is detected by a point sensor (for detecting a liquid precursor amount at several points in a depth direction; also referred to as a point type sensor). However, the use amount of the liquid precursor varies in some cases. The point detection is insufficient to make constant the amount of the liquid precursor at all times when starting a batch process. Therefore, by using the ultrasonic sensor 650 (continuous sensor), it is possible to continuously detect the amount of the liquid precursor.

Furthermore, in the above-described embodiment, a partially-concave recess 624 is formed on the bottom surface 622 that defines the storage space 612. The sensor element 652 of the ultrasonic sensor 650 is disposed in the recess 242. Therefore, for example, as compared with a distance (L2 in FIG. 7) between the liquid surface and the sensor element 652 in the case where no recess is formed on a bottom surface 922 as in a storage tank 910 according to a comparative embodiment shown in FIG. 7, a distance (L1 in FIG. 1) between the liquid surface and the sensor element 652 becomes long. Thus, in the present embodiment, even when the amount of the liquid precursor is small, the liquid level can be accurately detected as compared with the comparative embodiment.

Moreover, in the above-described embodiment, the initial liquid level is a liquid level available when a total sum of a minimum liquid precursor amount required for the ultrasonic sensor 650 to detect the liquid level and a liquid precursor amount required for performing the film-forming process a predetermined number of times (required for forming the AlO film on the wafer 200) is stored in the storage tank 610. In other words, the liquid level is kept at the lowest permissible position so that the absolute amount of impurities contained in the liquid precursor stored in the storage tank 610 becomes as small as possible. Even if the amount of the liquid precursor used in one batch varies, the liquid precursor is replenished (refilled) just as much as the reduced amount so that the liquid level after replenishment is kept constant at all times. Therefore, as compared with the case where the initial liquid level is located at, for example, the upper limit set value of the storage tank 610, the concentration of impurities contained in the precursor gas becomes small. It is therefore possible to improve the in-plane uniformity.

Furthermore, in the above-described embodiment, the storage tank 610 is not made completely empty. For example, when the liquid precursor is stored in the storage tank 610 just as much as an amount corresponding to one batch, variations occur in the in-plane uniformity of the AlO film. However, such variations do not occur in the present embodiment. In other words, in the present embodiment, it is possible to improve the in-plane uniformity of the AlO film formed on the wafer 200, as compared with the case where the storage tank 610 is made completely empty after completion of one batch process.

Although the present disclosure has been described in detail with respect to specific embodiments, the present disclosure is not limited to such embodiments. It will be apparent to those skilled in the art that various other embodiments may be adopted within the scope of the present disclosure. For example, in the above-described embodiment, the liquid precursor is vaporized into a precursor gas by a bubbling method. Alternatively, the liquid precursor may be vaporized into a precursor gas by a baking method, a direct vaporization method or the like.

Furthermore, in the above-described embodiment, the liquid level of the liquid precursor is detected using the ultrasonic sensor 650. However, a point sensor may be used together with the ultrasonic sensor 650. The point sensor may be used as a spare when the ultrasonic sensor 650 fails. As the point sensor, for example, a sensor that detects only the upper limit set value is used.

Furthermore, in the above-described embodiment, the storage tank 610 is used as the bubbler used for the bubbling method. However, a bubbler may be prepared separately from the storage tank 610. In this case, the liquid precursor is supplied from the storage tank 610 to the bubbler, and the liquid precursor supplied to the bubbler is vaporized.

Although not specifically described in the above-described embodiment, a temperature sensor for detecting the temperature of the liquid precursor may be used. By providing the temperature sensor, it is possible to appropriately perform quality control in a film-forming process. In addition, when an abnormality occurs in the consumption amount of the liquid precursor, it is possible to investigate the cause by referring to the value.

In the above-described embodiment, TMA is used as the liquid precursor for forming the AlO film on the wafer 200. However, for example, tert-butylimino tris(ethylmethylamino)tantalum (Ta[NC(CH$_3$)$_3$] [N(C$_2$H$_5$)CH$_3$]$_3$, abbreviation: TBTEMT) may be used in order to form a TaO film (tantalum oxide film) on the wafer 200.

Although not specifically described in the above-described embodiment, when the liquid level of the liquid precursor stored in the storage tank 610 reaches either the lower limit value or the upper limit value, the fact may be notified by an alarm, or interlock may be activated.

Although not specifically described in the above-described embodiment, the initial liquid level may be a liquid level available when a half of the liquid precursor storable in the storage tank 610 is stored in the storage tank 610. Accordingly, as compared with the case where the initial liquid level is located at, for example, the upper limit set value of the storage tank 610, the concentration of impurities contained in the precursor gas becomes smaller. It is therefore possible to improve the in-plane uniformity.

According to the present disclosure, it is possible to suppress variations in an in-plane uniformity value of a film formed on a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
 a process chamber in which a substrate is accommodated;
 a storage tank formed to include a bottom portion having a recess and a wall portion extending upward from a peripheral edge of the bottom portion, and configured to store a liquid precursor;
 a vaporizing part configured to vaporize the liquid precursor stored in the storage tank to generate a precursor gas;
 a supply part configured to supply the precursor gas generated by the vaporizing part to the process chamber;
 a sensor disposed in the recess and configured to detect a liquid level of the liquid precursor stored in the storage tank;
 a replenishment part configured to replenish the liquid precursor in the storage tank; and
 a controller configured to:
  control the supply part to supply the precursor gas to the process chamber to perform a substrate processing process for processing the substrate; and
  each time when the substrate processing process is performed a predetermined number of times, control the replenishment part, based on the liquid level of the liquid precursor detected by the sensor, to replenish the liquid precursor in the storage tank so that the liquid level of the liquid precursor stored in the storage tank becomes a predetermined level, the predetermined level being a liquid level available when a total sum of a minimum liquid precursor amount required for the sensor to detect the liquid level and a liquid precursor amount required for performing the substrate processing process the predetermined number of times is stored in the storage tank.

2. The apparatus of claim 1, wherein the minimum liquid precursor amount required for the sensor to detect the liquid level is an amount at which the liquid level is a lower limit value of the storage tank.

3. The apparatus of claim 1, wherein the liquid precursor amount required for performing the substrate processing process the predetermined number of times is a liquid precursor amount required for forming a predetermined film on the substrate by performing a cycle the predetermined number of times, the cycle including sequentially performing:
supplying the precursor gas into the process chamber;
removing the precursor gas in the process chamber;
supplying a reaction gas into the process chamber; and
removing the reaction gas in the process chamber.

4. The apparatus of claim 1, wherein the sensor is an ultrasonic sensor and is configured to continuously detect the liquid level of the liquid precursor.

5. The apparatus of claim 1, further comprising:
a gas supply pipe configured to supply a carrier gas, the gas supply pipe penetrating a ceiling portion of the storage tank and having one end disposed in the liquid precursor stored in the storage tank,
wherein the vaporizing part is configured so that the carrier gas supplied from the gas supply pipe acts on the liquid precursor to vaporize the liquid precursor to generate the precursor gas.

6. A liquid precursor replenishment system, comprising:
a storage tank formed to include a bottom portion having a recess and a wall portion extending upward from a peripheral edge of the bottom portion, and configured to store a liquid precursor;
a vaporizing part configured to vaporize the liquid precursor stored in the storage tank to generate a precursor gas;
a supply part configured to supply the precursor gas generated by the vaporizing part to an object;
a sensor disposed in the recess and configured to detect a liquid level of the liquid precursor stored in the storage tank;
a replenishment part configured to replenish the liquid precursor in the storage tank; and
a controller configured to:
control the supply part to supply the precursor gas to the object; and
each time when the precursor gas is supplied to the object a predetermined number of times, control the replenishment part, based on the liquid level of the liquid precursor detected by the sensor, to replenish the liquid precursor in the storage tank so that the liquid level of the liquid precursor stored in the storage tank becomes a predetermined level, the predetermined level being a liquid level available when a total sum of a minimum liquid precursor amount required for the sensor to detect the liquid level and a liquid precursor amount required for performing a substrate processing process the predetermined number of times is stored in the storage tank.

7. The system of claim 6, wherein the minimum liquid precursor amount required for the sensor to detect the liquid level is an amount at which the liquid level is a lower limit value of the storage tank.

8. The system of claim 6, wherein the liquid precursor amount required for performing the substrate processing process the predetermined number of times is a liquid precursor amount required for forming a predetermined film on a substrate by performing a cycle the predetermined number of times, the cycle including sequentially performing:
supplying the precursor gas into a process chamber;
removing the precursor gas in the process chamber;
supplying a reaction gas into the process chamber; and
removing the reaction gas in the process chamber.

9. The system of claim 6, wherein the sensor is an ultrasonic sensor and is configured to continuously detect the liquid level of the liquid precursor.

10. The system of claim 6, further comprising:
a gas supply pipe configured to supply a carrier gas, the gas supply pipe penetrating a ceiling portion of the storage tank and having one end disposed in the liquid precursor stored in the storage tank,
wherein the vaporizing part is configured so that the carrier gas supplied from the gas supply pipe acts on the liquid precursor to vaporize the liquid precursor to generate the precursor gas.

11. A method of manufacturing a semiconductor device, comprising a process of performing:
storing a liquid precursor in a storage tank formed to include a bottom portion having a recess and a wall portion extending upward from a peripheral edge of the bottom portion, so that a liquid level of the liquid precursor stored in the storage tank becomes a predetermined level;
vaporizing the liquid precursor stored in the storage tank into a precursor gas;
processing a substrate using the precursor gas; and
replenishing the liquid precursor in the storage tank each time when the act of processing is performed a predetermined number of times so that the liquid level of the liquid precursor stored in the storage tank becomes the predetermined level, based on a liquid level of the liquid precursor detected by a sensor disposed in the recess to detect the liquid level of the liquid precursor stored in the storage tank, the predetermined level is a liquid level available when a total sum of a minimum liquid precursor amount required for the sensor to detect the liquid level and a liquid precursor amount required for performing the act of processing the predetermined number of times is stored in the storage tank.

* * * * *